US011856870B2

(12) United States Patent
Lai et al.

(10) Patent No.: US 11,856,870 B2
(45) Date of Patent: Dec. 26, 2023

(54) MRAM STRUCTURE AND METHOD OF FABRICATING THE SAME

(71) Applicant: UNITED MICROELECTRONICS CORP., Hsin-Chu (TW)

(72) Inventors: Kuo-Chih Lai, Tainan (TW); Yi-Syun Chou, Taipei (TW); Ko-Wei Lin, Taichung (TW); Pei-Hsun Kao, Kaohsiung (TW); Wei Chen, Tainan (TW); Chia-Fu Cheng, Taipei (TW); Chun-Yao Yang, Kaohsiung (TW); Chia-Chang Hsu, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/844,741

(22) Filed: Jun. 21, 2022

(65) Prior Publication Data
US 2022/0320420 A1    Oct. 6, 2022

Related U.S. Application Data

(62) Division of application No. 16/506,983, filed on Jul. 9, 2019, now Pat. No. 11,404,631.

(30) Foreign Application Priority Data

Jun. 19, 2019    (TW) .................................. 108121251

(51) Int. Cl.
*H10N 50/80*    (2023.01)
*H10B 61/00*    (2023.01)
*H10N 50/01*    (2023.01)

(52) U.S. Cl.
CPC ............. *H10N 50/80* (2023.02); *H10B 61/00* (2023.02); *H10N 50/01* (2023.02)

(58) Field of Classification Search
None
See application file for complete search history.

(56) References Cited

U.S. PATENT DOCUMENTS

| | | |
|---|---|---|
| 9,818,935 B2 | 11/2017 | Chuang |
| 10,069,064 B1 | 9/2018 | Haq |
| 10,210,920 B1 | 2/2019 | Chen |
| 2011/0198715 A1 | 8/2011 | Matsuoka |
| 2012/0051075 A1 | 3/2012 | Harada |
| 2012/0205764 A1* | 8/2012 | Chen ..................... H10N 50/80 257/422 |
| 2012/0217594 A1 | 8/2012 | Kajiyama |

(Continued)

FOREIGN PATENT DOCUMENTS

| | | |
|---|---|---|
| CN | 101774531 A | 7/2010 |
| JP | 2013-143548 A | 7/2013 |

*Primary Examiner* — Michelle Mandala
*Assistant Examiner* — Jordan M Klein
(74) *Attorney, Agent, or Firm* — Winston Hsu (57) ABSTRACT

A magnetoresistive random access memory (MRAM) structure includes a magnetic tunnel junction (MTJ), and a top electrode which contacts an end of the MTJ. The top electrode includes a top electrode upper portion and a top electrode lower portion. The width of the top electrode upper portion is larger than the width of the top electrode lower portion. A bottom electrode contacts another end of the MTJ. The top electrode, the MTJ and the bottom electrode form an MRAM.

4 Claims, 5 Drawing Sheets

(56) References Cited

U.S. PATENT DOCUMENTS

| | | | |
|---|---|---|---|
| 2015/0171314 A1* | 6/2015 | Li | G11C 11/1659 |
| | | | 257/421 |
| 2015/0311251 A1 | 10/2015 | Yi | |
| 2016/0268336 A1* | 9/2016 | Shum | H10N 50/01 |
| 2016/0308119 A1 | 10/2016 | Hsu | |
| 2016/0351792 A1* | 12/2016 | Jiang | H10B 61/20 |
| 2017/0047510 A1 | 2/2017 | Chen | |
| 2017/0104029 A1* | 4/2017 | Li | H10N 50/10 |

* cited by examiner

MRAM STRUCTURE AND METHOD OF FABRICATING THE SAME

CROSS REFERENCE TO RELATED APPLICATIONS

This application is a division of U.S. application Ser. No. 16/506,983, filed on Jul. 9, 2019. The content of the application is incorporated herein by reference.

BACKGROUND OF THE INVENTION

1. Field of the Invention

The present invention relates to a method of fabricating a magnetoresistive random access memory (MRAM), and more particularly to a method of fabricating a top electrode of the MRAM.

2. Description of the Prior Art

Many modern day electronic devices contain electronic memory configured to store data. Electronic memory may be volatile memory or non-volatile memory. Volatile memory stores data only while it is powered, while non-volatile memory is able to store data even when power is removed. MRAM is one promising candidate for next generation non-volatile memory technology. An MRAM cell includes a magnetic tunnel junction (MTJ) having a variable resistance located between two electrodes disposed within back-end-of-the-line (BEOL) metallization layers.

An MTJ generally includes a layered structure comprising a reference layer, a free layer and a tunnel oxide in between. The reference layer of magnetic material has a magnetic moment that always points in the same direction. The magnetic moment of the free layer is free, but is determined by the physical dimensions of the element. The magnetic moment of the free layer points in either of two directions: parallel or anti-parallel to the magnetization direction of the reference layer.

As dimensions of the MRAMs are scaled down, more digits are needed to be stored in a smaller area. An improved MRAM structure is therefore required in the field.

SUMMARY OF THE INVENTION

It is an objective of the present invention to provide an MRAM structure which solves the problems of the related arts.

According to a first preferred embodiment of the present invention, an MRAM structure includes an MTJ and a top electrode contacting a first end of the MTJ. The top electrode includes a top electrode upper portion and a top electrode lower portion, and a width of the top electrode upper portion is larger than a width of the top electrode lower portion. A bottom electrode contacts a second end of the MTJ, wherein the top electrode, the MTJ and the bottom electrode form an MRAM.

According to a second preferred embodiment of the present invention, a method of fabricating an MRAM structure includes providing a first dielectric layer. Next, a bottom electrode material layer is formed to cover the first dielectric layer. After that, an MTJ composite layer is formed to cover the bottom electrode material layer. Later, a first top electrode material layer is formed to cover the MTJ composite layer. Subsequently, the first top electrode material layer, the MTJ composite layer and the bottom electrode material layer are patterned to form a top electrode lower portion, an MTJ and a bottom electrode. After that, a second dielectric layer is formed to cover the first dielectric layer, and a top surface of the second dielectric layer is aligned with a top surface of the top electrode lower portion. Next, a second top electrode material layer is formed to cover the second dielectric layer. Finally, the second top electrode material layer is patterned to form a top electrode upper portion, wherein the top electrode upper portion connects to the top electrode lower portion, the top electrode upper portion and the top electrode lower portion form a top electrode, a width of the top electrode upper portion is larger than a width of the top electrode lower portion, and the top electrode, the MTJ and the bottom electrode form an MRAM.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 9 depict a method of fabricating an MRAM structure according to a preferred embodiment of the present invention, wherein:

DETAILED DESCRIPTION

FIG. 1 to FIG. 9 depict a method of fabricating an MRAM structure according to a preferred embodiment of the present invention.

Figure 1:
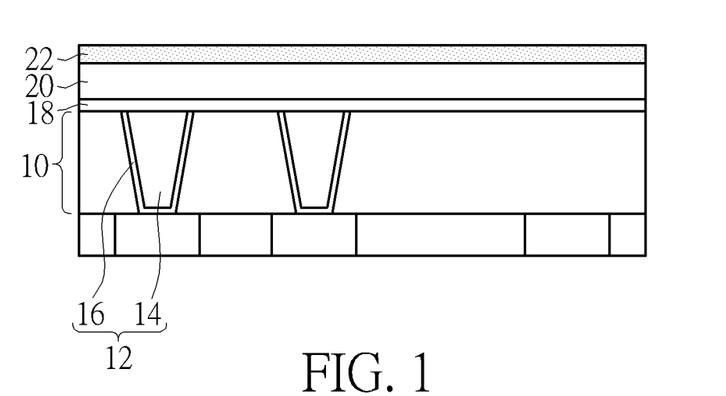
FIG. 1 shows a stage of providing a first dielectric layer and a bottom contact plug therein.

As shown in FIG. 1, a substrate such as a silicon substrate is provided. Metal interconnections are disposed within the substrate. A first dielectric layer 10 is formed to cover the substrate. At least one bottom electron contact plug 12 is embedded within the first dielectric layer 10. The bottom electron contact plug 12 may include a metal layer 14 and a barrier 16. The barrier 16 is optional. The metal layer 14 is preferably tungsten. The barrier 16 can be tungsten nitride. A top surface of the bottom electron contact plug 12 is aligned with a top surface of the first electric layer 10. Next, a bottom electron material layer 18 is formed to cover and contact the first dielectric layer 10. After that, an MTJ composite layer 20 is formed to cover and contact the bottom electron material layer 18. Subsequently, a first top electrode material layer 22 is formed to cover the MTJ composite layer 20. The MTJ composite layer 20 includes multiple material layers. For example, the MTJ composite layer 20 includes numerous ferromagnetic material layers and at least one insulating layer disposed between each of the ferromagnetic material layers. The first dielectric layer 10 includes silicon oxide or silicon carbide nitride. The bottom electron material layer 18, the MTJ composite layer 20 and first top electrode material layer 22 may be respectively formed by a deposition process such as a chemical vapor deposition, a physical vapor deposition or an atomic layer deposition.

Figure 2:
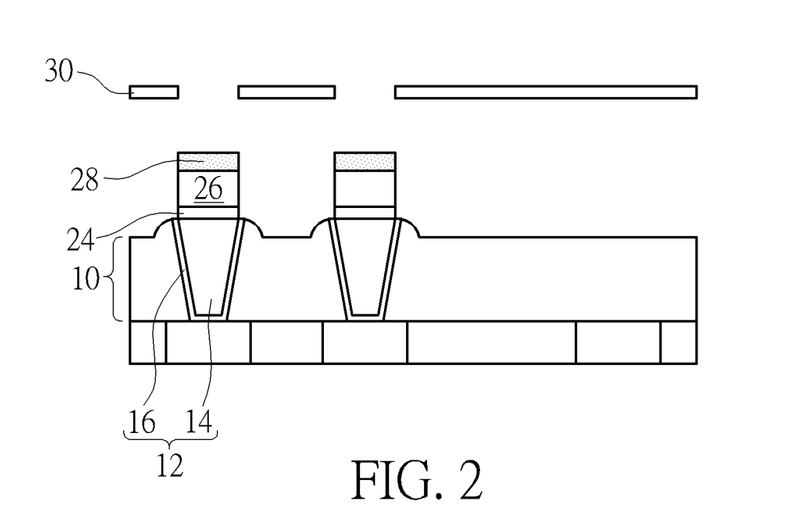
FIG. 2 is a method following FIG. 1.

As shown in FIG. 2, the first top electrode material layer 22, the MTJ composite layer 20 and the bottom electron material layer 18 are patterned to form a top electrode lower portion 28, an MTJ 26 and a bottom electrode 24. Refer to FIG. 1 and FIG. 2 together. A mask layer (not shown) is formed to cover the first top electrode material layer 22. A position of the top electrode lower portion 28 is defined on the mask layer by a photo mask 30. After that, the first top electrode material layer 22 is etched to form the top electrode lower portion 28. Subsequently, the mask layer is removed. Next, the MTJ composite layer 20 and the bottom electron material layer 18 are etched by taking the top electrode lower portion 28 as a mask to form the MTJ 26 and the bottom electrode 24.

Figure 3:
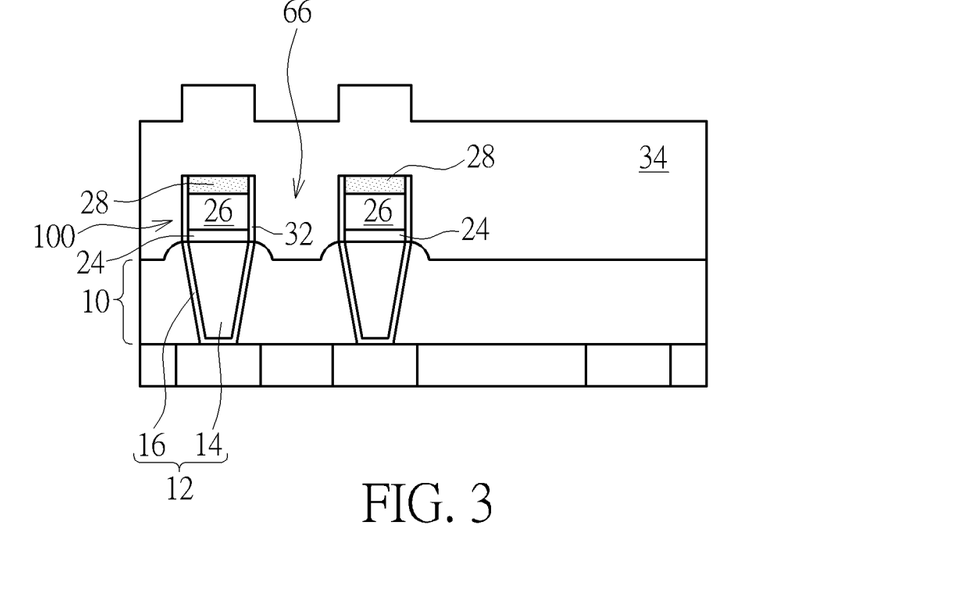
FIG. 3 is a method following FIG. 2.
Figure 4:
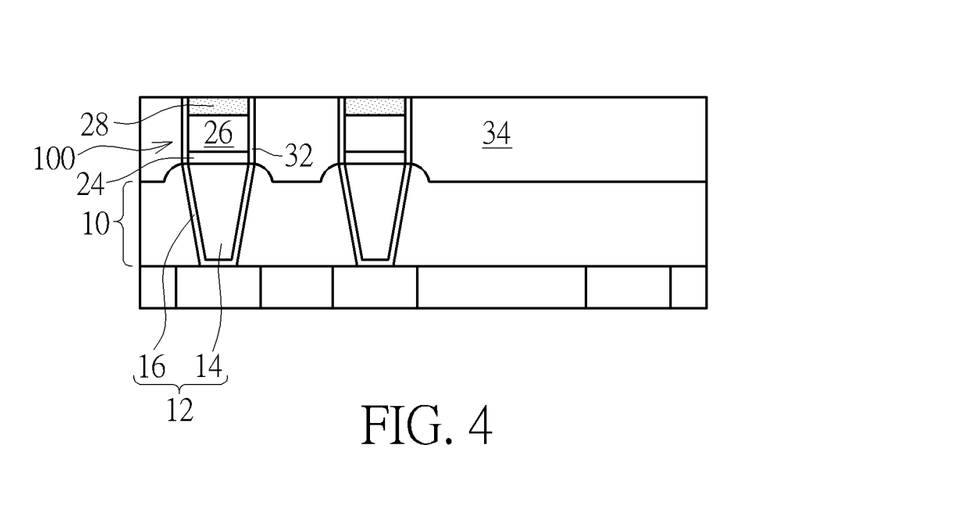
FIG. 4 is a method following FIG. 3.
Figure 5:
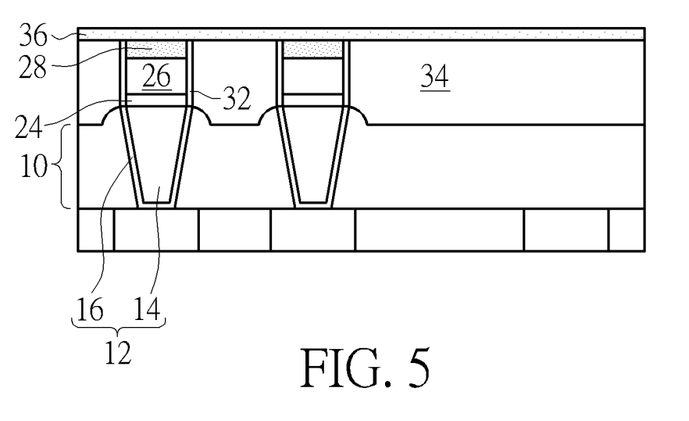
FIG. 5 is a method following FIG. 4.

As shown in FIG. 3, a spacer 32 is formed around the top electrode lower portion 28, the MTJ 26 and the bottom electrode 24. Next, a second dielectric layer 34 is formed to cover the first dielectric layer 10. The spacer 32 may be silicon nitride or other insulating materials. The second dielectric layer 34 is a low-k dielectric material. For example, the second dielectric layer 34 may be a material which has a dielectric constant lower than 2.7 such as silicon oxide carbides (SiOC). As shown in FIG. 4, the second dielectric layer 34 is planarized to make a top surface of the second dielectric layer 34 align with a top surface of the top electrode lower portion 28. As shown in FIG. 5, a second top electrode material layer 36 is formed to cover the second dielectric layer 34. The second top electrode material layer 36 contacts the top electrode lower portion 28. The first top electrode material layer 22 and the second top electrode material layer 36 may independently include tantalum, titanium, tantalum nitride or other metal materials. The second top electrode material layer 36 can be formed by a deposition process such as a chemical vapor deposition, a physical vapor deposition or an atomic layer deposition.

Figure 6:
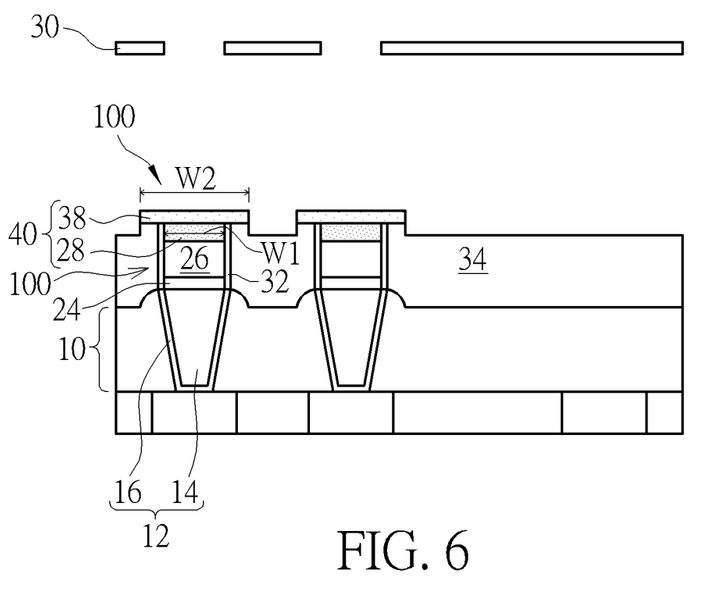
FIG. 6 is a method following FIG. 5.

As shown in FIG. 6, the second top electrode material layer 36 is patterned to form a top electrode upper portion 38. A width W2 of the top electrode upper portion 38 is larger than a width W1 of the top electrode lower portion 28. In detail, a mask layer (not shown) is formed to cover the second top electrode material layer 36. The position of the top electrode upper portion is defined on the mask layer by the photo mask 30. By adjusting the exposure references, the same photo mask 30 used in FIG. 2 can be used to define a width larger than the width W1 of the top electrode lower portion 28. Later, the second top electrode material layer 36 is patterned to form the top electrode upper portion 38 by taking the mask layer as a mask. The top electrode upper portion 38 connects to the top electrode lower portion 28. The top electrode upper portion 38 and the top electrode lower portion 28 form a top electrode 40. The top electrode 40, the MTJ 26 and the bottom electrode 24 form a MRAM 100. At this point, the MRAM 100 of the present invention is completed. Because the second top electrode material layer 36 is formed after forming the spacer 32, the spacer 32 does not surround the sidewall of the top electrode upper portion 38, but only contacts the bottom of the top electrode upper portion 38.

Figure 7:
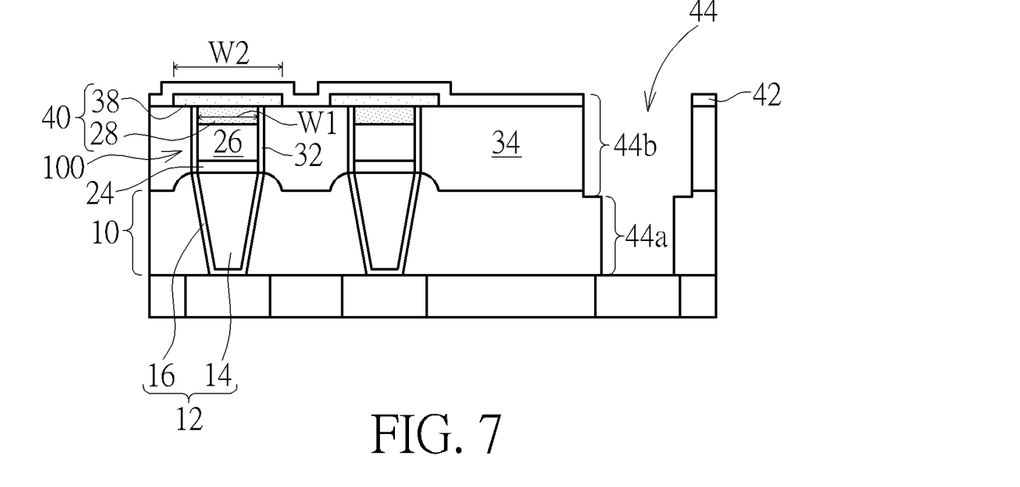
FIG. 7 is a method following FIG. 6.
Figure 8:
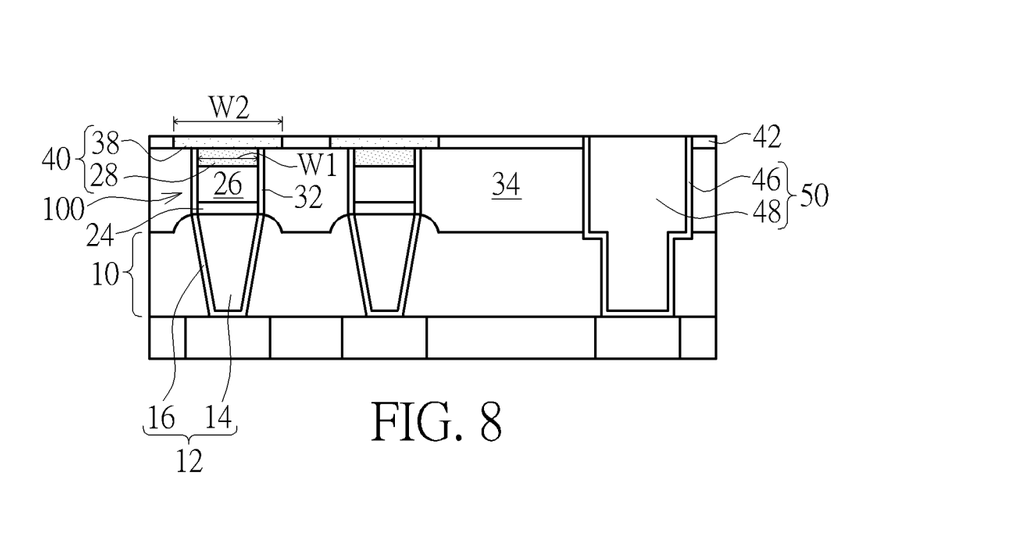
FIG. 8 is a method following FIG. 7.

As shown in FIG. 7, a third dielectric layer 42 is formed to conformally cover the second dielectric layer 34 and the top electrode upper portion 38. The third dielectric layer 42 is a low-k dielectric material. For example, the third dielectric layer 42 may be a material which has a dielectric constant lower than 2.7 such as silicon oxide carbides (SiOC). Later, a dual damascene opening 44 is formed within the third dielectric layer 42, the second dielectric layer 34 and the first dielectric layer 10 at one side of the MRAM 100. The dual damascene opening 44 includes a contact hole 44a and a trench 44b on the contact hole 44a. The steps of forming the dual damascene opening 44 include etching the third dielectric layer 42 and the second dielectric layer 34 by taking the first dielectric layer 10 as an etching stop layer to form a hole in the third dielectric layer 42 and the second dielectric layer 34. The hole has the same size as the contact hole 44a. Later, after defining the position of the trench 44b, the third dielectric layer 42 and the second dielectric layer 34 around the hole are etched and the first dielectric layer 10 below the hole is also etched to form the trench 44b in the third dielectric layer 42 and in the second dielectric layer 34 and to form the contact hole 44a in the first dielectric layer 10. As shown in FIG. 8, a barrier 46 and a metal layer 48 are formed to fill in the dual damascene opening 44. The barrier 46 and the metal layer 48 serve as a first dual damascene structure 50. The first dual damascene structure 50 is a part of the metal interconnection. According to another preferred embodiment, the barrier 46 can be omitted. Next, a planarization process such as a chemical mechanical planarization is performed to make the top surface of the third dielectric layer 42, the top surface of the barrier 46 and the top surface the metal layer 48 to align with the top surface of the top electrode upper portion 38, i.e. the top surface of the first dual damascene structure 50 is aligned with the top surface of the top electrode upper portion 38. Furthermore, the bottom of the first dual damascene structure 50 is aligned with the bottom of the bottom electrode contact plug 12.

Figure 9:
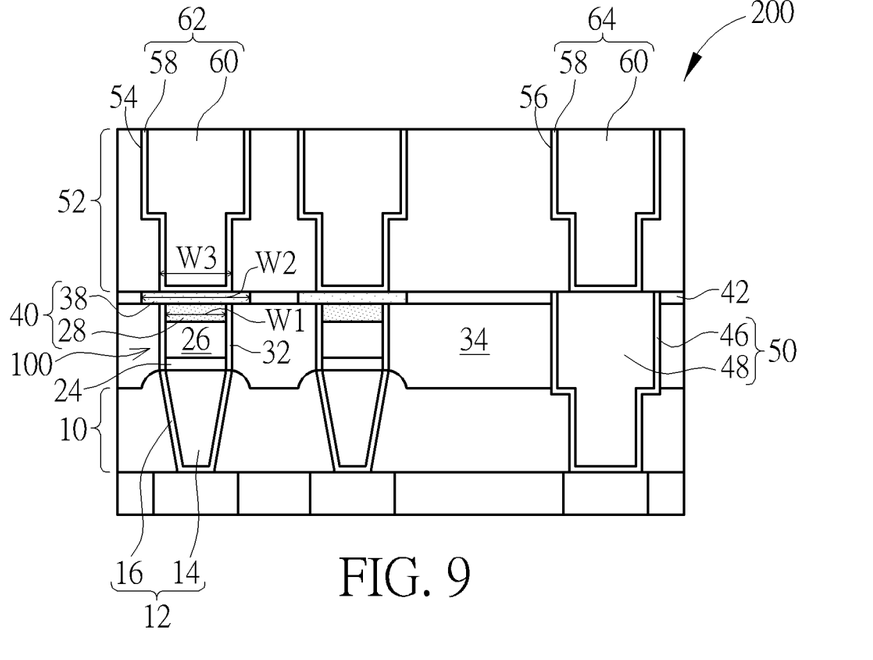
FIG. 9 is a method following FIG. 8.

As shown in FIG. 9, a fourth dielectric layer 52 is formed to cover the third dielectric layer 42. Next, two dual damascene openings 54/56 are formed within the third dielectric layer 42 to expose the top electrode upper portion 38 and the first dual damascene structure 50, respectively. Then, a barrier 58 and a metal layer 60 are formed in the dual damascene openings 54/56 to complete a second dual damascene structure 62 and a third dual damascene structure 64. The second dual damascene structure 62 and the third dual damascene structure 64 serve as part of the metal interconnection. The second dual damascene structure 62 contacts the top electrode upper portion 38. The third dual damascene structure 64 contacts the first dual damascene structure 50. The second dual damascene structure 62 has a bottom surface contacting the top electrode upper portion 38. The width W3 of the bottom surface is smaller than the width W2 of the top electrode upper portion 38. The metal layers 48/60 of the first dual damascene structure 50, the second dual damascene structure 62 and the third dual damascene structure 64 can be copper, tungsten or other conductive materials. The barriers 46/58 can be tungsten nitride or tantalum nitride.

It is noteworthy that, because the width W2 of the top electrode upper portion 38 is larger than the width W3 of the bottom surface of the second dual damascene structure 62, even though there is an etching offset during the formation of the second dual damascene structure 62, the dual damascene opening 54 can still stop within the range of the width W2 of the top electrode upper portion 38. Because the dual damascene opening 54 is guaranteed to be stopped on the top electrode upper portion 38, the second dual damascene structure 62 will not penetrate too much of the second dielectric layer 34 and will not reach around the MRAM 100 because of the etching offset. In the conventional method, the dual damascene structure is prevented from being around the MRAM by increasing the total thickness of the top electrode to thereby increase the distance between the dual damascene structure and the MRAM. The present invention does not need to increase the thickness of the top electrode.

Because the thickness of the top electrode 40 is smaller than the conventional top electrode, the inner stress of the top electrode 40 of the present invention can be smaller. In this way, the MTJ 26 in the MRAM 100 receives less stress and the composite materials in the MTJ 26 will not be torn off due to stress. Furthermore, the top electrode 40 of the present invention is formed in two steps including the steps of making the top electrode upper portion 38 and the top electrode lower portion 28, and the total thickness of the top electrode 40 of the present invention is smaller than in the conventional method. Therefore, under the circumstance of forming numerous MRAMs 100, during the step of forming the second dielectric layer 34, the recess 66 between the top electrode lower portion 28, the MTJ 26 and the bottom electrode 24 within two adjacent MRAMs 100 will not have a large aspect ratio and a gap can be prevented from being formed in the recess 66.

As shown in FIG. 9, according to a second preferred embodiment of the present invention, an MRAM structure 200 includes an MTJ 26. A top electrode 40 contacts an end of the MTJ 26. A bottom electrode 24 contacts another end of the MTJ 26. The top electrode 40 includes a top electrode upper portion 38 and a top electrode lower portion 28. The top electrode upper portion 38 connects to the top electrode lower portion 28. A width W2 of the top electrode upper portion 38 is larger than a width W1 of the top electrode lower portion 28. The width W1 of the top electrode lower portion 28 is the same as a width of the MTJ 26. Moreover, the top electrode lower portion 28 contacts the MTJ 26. The top electrode 40, the MTJ 26 and the bottom electrode 24 form an MRAM 100. A bottom electrode contact plug 12 is disposed under the bottom electrode 24 and contacts the bottom electrode 24. A first dual damascene structure 50 is disposed at one side of the MRAM 100. The top surface of the first dual damascene structure 50 is aligned with the top surface of the top electrode upper portion 38. The bottom of the first dual damascene structure 50 is aligned with the bottom of the bottom electrode contact plug 12. The first dual damascene structure 50 includes a metal layer 48 and a barrier 46. The barrier 46 is optional.

A second dual damascene structure 62 is disposed on the top electrode 40 and contacts the top electrode upper portion 38. The second dual damascene structure 62 has a bottom surface contacting the top electrode upper portion 38. A width W3 of the bottom surface is smaller than the width W2 of the top electrode upper portion 38. A spacer 32 surrounds the bottom electrode 24, the MTJ 26 and the top electrode lower portion 28. The spacer 32, however, does not surround the top electrode upper portion 38. The spacer 32 only contacts the bottom of the top electrode upper portion 38. The second dual damascene structure 62 includes a metal layer 60 and a barrier 58. The barrier 58 is optional.

The top electrode lower portion 28 and the top electrode upper portion 38 may independently include titanium nitride, tantalum nitride or other conductive materials. Similarly, the bottom electrode 24 can include titanium nitride, tantalum nitride or other conductive materials. The MTJ 26 includes numerous ferromagnetic material layers and at least one insulating layer disposed between each of the ferromagnetic material layers. The spacer 32 may be silicon nitride or other insulating materials.

The metal layers 48/60 of the first dual damascene structure 50, and the second dual damascene structure 62 can be copper, tungsten or other conductive materials. The barriers 46/58 can be tungsten nitride or tantalum nitride.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a magnetoresistive random access memory (MRAM) structure comprising:
   providing a first dielectric layer;
   forming a bottom electrode material layer covering the first dielectric layer;
   forming a magnetic tunnel junction (MTJ) composite layer covering the bottom electrode material layer;
   forming a first top electrode material layer covering the MTJ composite layer;
   patterning the first top electrode material layer, the MTJ composite layer and the bottom electrode material layer to form a top electrode lower portion, an MTJ and a bottom electrode, wherein the top electrode lower portion is formed by using a photo mask to define a position of the top electrode lower portion;
   forming a second dielectric layer covering the first dielectric layer, wherein a top surface of the second dielectric layer is aligned with a top surface of the top electrode lower portion;
   forming a second top electrode material layer covering the second dielectric layer; and
   patterning the second top electrode material layer to form a top electrode upper portion, wherein the top electrode upper portion connects to the top electrode lower portion, the top electrode upper portion and the top electrode lower portion form a top electrode, a width of the top electrode upper portion is larger than a width of the top electrode lower portion, and the top electrode, the MTJ and the bottom electrode form an MRAM, and wherein the top electrode upper portion is formed by using the photo mask to define a position of the top electrode upper portion, and exposure references are different when forming the top electrode lower portion and forming the top electrode upper portion so as to make the width of the top electrode upper portion and the width of the top electrode lower portion different from each other.

2. The method of fabricating an MRAM structure of claim 1, further comprising:
   before forming the bottom electrode material layer, forming a bottom electrode contact plug embedded in the first dielectric layer, wherein the bottom electrode contact plug is under the bottom electrode and contacts the bottom electrode; and
   after forming the MRAM, forming a first conductive line at one side of the MRAM, wherein a top surface of the first conductive line is aligned with a top surface of the top electrode upper portion, and a bottom of the first conductive line is aligned with a bottom of the bottom electrode contact plug.

3. The method of fabricating an MRAM structure of claim 1, further comprising:
   forming a second conductive line on the top electrode and contacting the top electrode upper portion, wherein the second conductive line has a bottom surface contacting the top electrode upper portion, and a width of the bottom surface is smaller than the width of the top electrode upper portion.

4. The method of fabricating an MRAM structure of claim 1, wherein the steps of patterning the first top electrode material layer, the MTJ composite layer and the bottom electrode material layer comprise:
- defining the position of the top electrode lower portion by the photo mask;
- patterning the first top electrode material layer to form the top electrode lower portion; and
- patterning the MTJ composite layer and the bottom electrode material layer by taking the top electrode lower portion as a mask to form the MTJ and the bottom electrode.

* * * * *